(12) United States Patent
Yoo et al.

(10) Patent No.: US 7,485,959 B2
(45) Date of Patent: Feb. 3, 2009

(54) STRUCTURE FOR JOINING A SEMICONDUCTOR PACKAGE TO A SUBSTRATE USING A SOLDER COLUMN

(75) Inventors: Cheol-Joon Yoo, Chungcheongnam-do (KR); Jin-Ho Kim, Chungcheongnam-do (KR); Hee-Jin Park, Chungcheongnam-do (KR); Tae-Sung Yoon, Chungcheongnam-do (KR); Chan-Suk Lee, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/330,773

(22) Filed: Jan. 11, 2006

(65) Prior Publication Data

US 2006/0157848 A1 Jul. 20, 2006

(30) Foreign Application Priority Data

Jan. 14, 2005 (KR) .................. 10-2005-0003751

(51) Int. Cl.
*H01L 23/48* (2006.01)
*H01L 21/44* (2006.01)

(52) U.S. Cl. .............. 257/737; 257/E23.069; 257/E23.021; 257/738; 257/778; 257/772; 257/773; 257/774; 257/698; 257/690; 257/691; 257/692; 257/693

(58) Field of Classification Search ............... 257/737, 257/E23.069, E23.021, 734, 738, 778, 772, 257/773, 774, 690, 691, 692, 693, 698
See application file for complete search history.

(56) References Cited

U.S. PATENT DOCUMENTS

| 6,274,389 | B1* | 8/2001 | Iida et al. ................ 438/4 |
| 6,469,393 | B2* | 10/2002 | Oya ........................ 257/779 |
| 6,622,380 | B1 | 9/2003 | Grigg |
| 6,956,293 | B2* | 10/2005 | Takaike ................... 257/781 |

FOREIGN PATENT DOCUMENTS

| JP | 11-297889 | 10/1999 |
| KR | 2002-0052570 | 7/2002 |

* cited by examiner

*Primary Examiner*—Alexander O Williams
(74) *Attorney, Agent, or Firm*—Marger Johnson & McCollom, P.C.

(57) ABSTRACT

A semiconductor package and a package mounting substrate can be joined using a conductive material column. Each of the semiconductor package and the package mounting substrate include an insulating protective opening exposing a wiring layer therein. The solder column resides within the insulating protective openings to electrically couple the wiring layers. The insulating protective openings protect the solder column against stress faults to form reliable electrical connections and to support high-density electrical connections between the semiconductor package and the package mounting substrate.

14 Claims, 6 Drawing Sheets

STRUCTURE FOR JOINING A SEMICONDUCTOR PACKAGE TO A SUBSTRATE USING A SOLDER COLUMN

PRIORITY STATEMENT

This U.S. non-provisional application claims priority under 35 U.S.C. § 119 to Korean Patent Application No. 2005-3751 filed Jan. 14, 2005, the contents of which are incorporated by reference.

BACKGROUND OF THE INVENTION

1. Field of the Invention

The present invention relates to a semiconductor packaging technique, and more particularly, to a structure and method to join a semiconductor package and a substrate.

2. Description of the Related Art

As integrated circuit chips become more integrated, the chips tend to receive and transmit more input and output signals. Accordingly, semiconductor packages need to accommodate more, e.g., denser, external connection terminals in smaller or more limited areas. Ball grid array (BGA) packages, for example, have addressed such needs.

Figure 1:
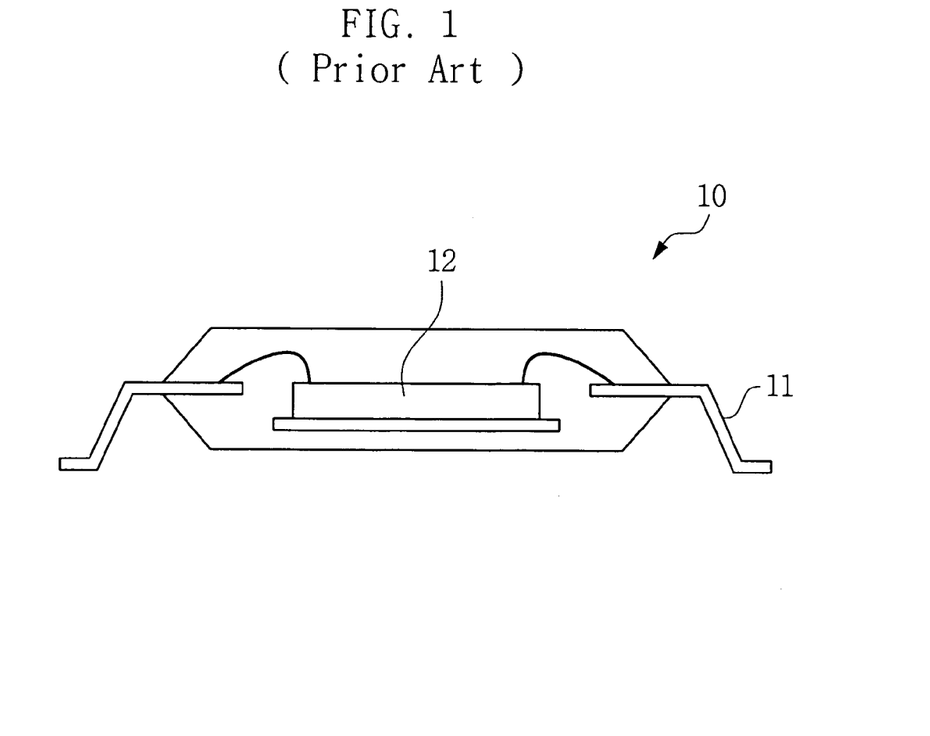
FIG. 1 (Prior Art) is a schematic cross-sectional view of a conventional semiconductor package using a lead frame.
Figure 2A:
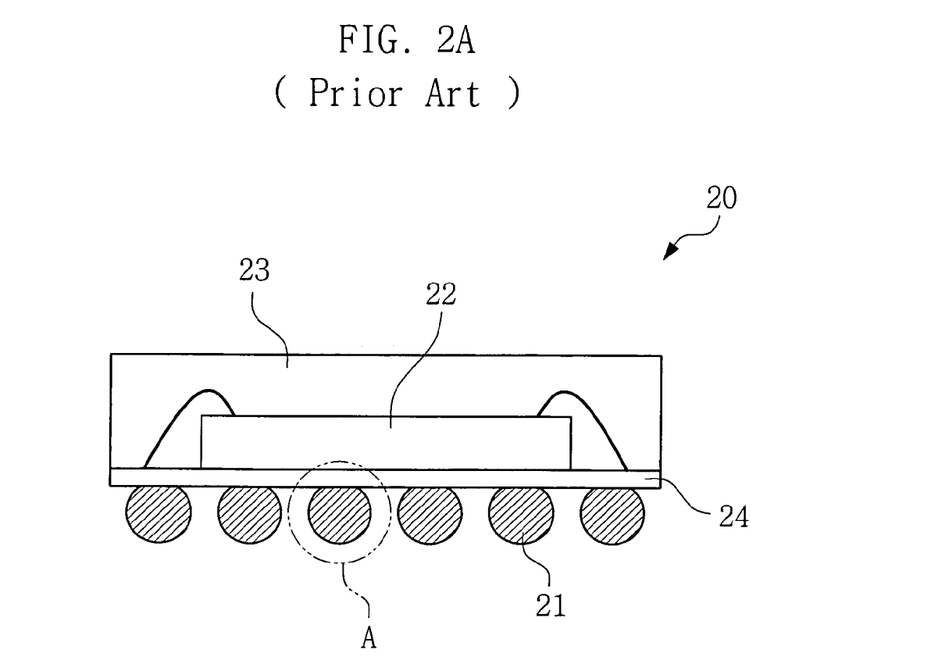
FIG. 2A (Prior Art) is a schematic cross-sectional view of a conventional semiconductor package using solder bumps.

A lead frame package may use leads as external connection terminals, while a BGA package may use solder bumps as external connection terminals. The leads in a lead frame package may be provided along a semiconductor chip in a one-dimensional arrangement. The solder bumps in a BGA package may be provided on one surface of a semiconductor chip in a two-dimensional arrangement. As shown in FIG. 1, a leadframe package 10 may include a semiconductor chip 12 and leads 11 arranged along the semiconductor chip 12. As shown in FIG. 2A, a BGA package 20 may include a semiconductor chip 22 and solder bumps 21 arranged on one surface of the semiconductor chip 22.

Figure 2B:
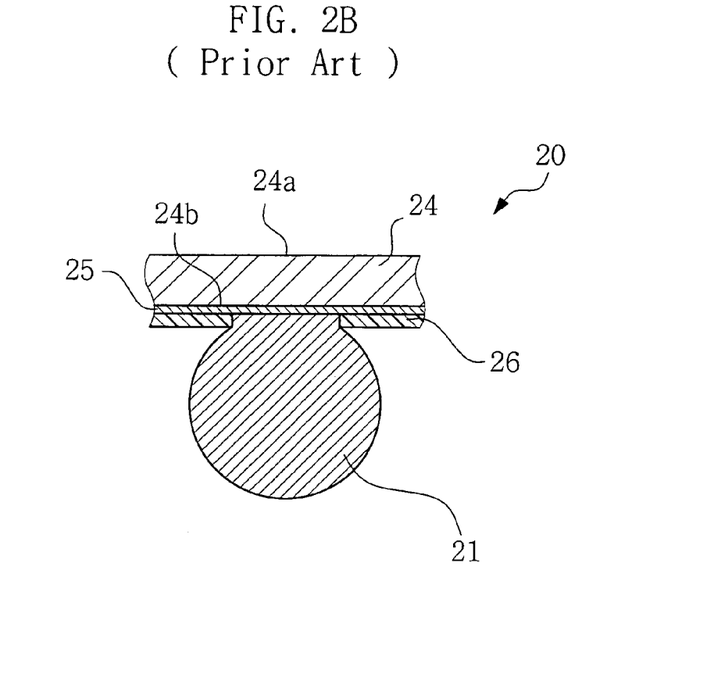
FIG. 2B (Prior Art) is an enlarged cross-sectional view of area A in FIG. 2A.

FIG. 2B is an enlarged cross-sectional view of area A in FIG. 2A. Referring to FIGS. 2A and 2B, the BGA package 20 may include a printed circuit board 24 having an upper surface 24a and a lower surface 24b. An integrated chip 22 may be mounted on the upper surface 24a of the printed circuit board 24. An encapsulant 23 may seal a raised portion formed on the upper surface 24a of the printed circuit board 24. Solder bumps 21 may be provided on the lower surface 24b of the printed circuit board 24. A copper wiring layer 25 may be formed on the lower surface 24b of the printed circuit board 24. An insulating protective layer 26 may be provided on the copper wiring layer 25 and provide openings therethrough to expose a portion of the copper wiring layer 25. The solder bumps 21 may be attached to the exposed copper wiring layer 25.

Figure 3:
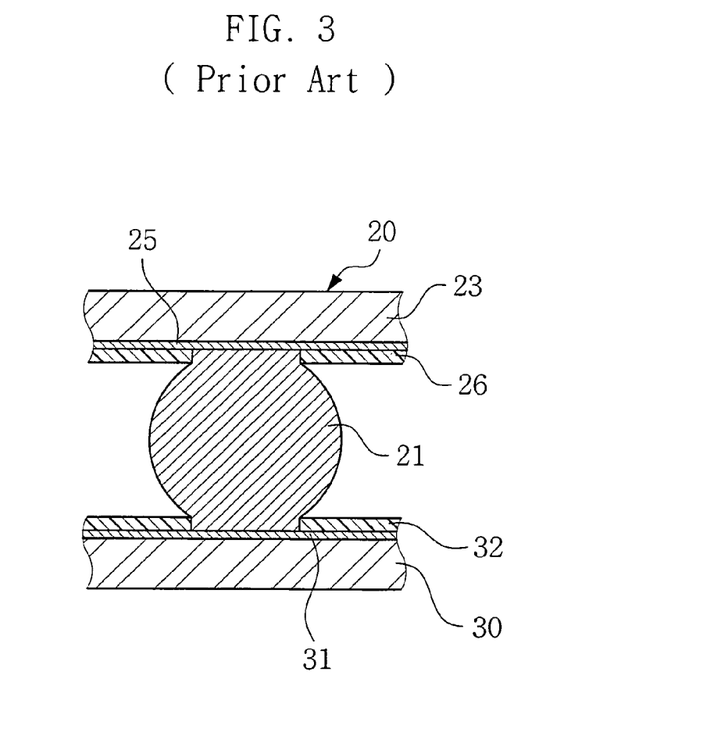
FIG. 3 (Prior Art) is a cross-sectional view of a conventional structure for joining a semiconductor package to a package mounting substrate using a solder bump.

FIG. 3 is a cross-sectional view of a structure for joining a semiconductor package 20 to a package mounting substrate 30. Referring to FIG. 3, the semiconductor package 20 may be mechanically and electrically connected to the package mounting substrate 30 using a solder bump 21. The package mounting substrate 30 may have a copper wiring layer 31 and an insulating protective layer 32.

Figure 4A:
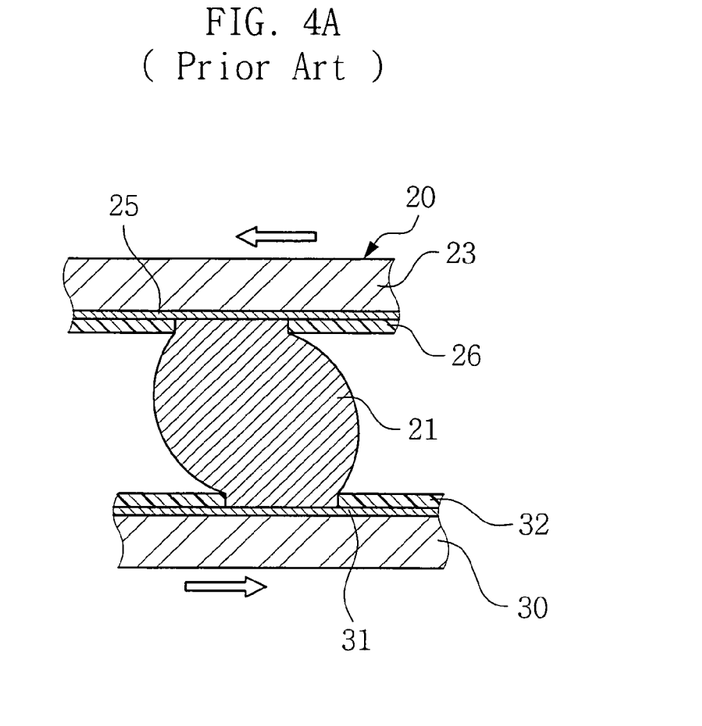
FIGS. 4A and 4B (Prior Art) are cross-sectional views illustrating faults which may occur to the structure of FIG. 3.
Figure 4B:
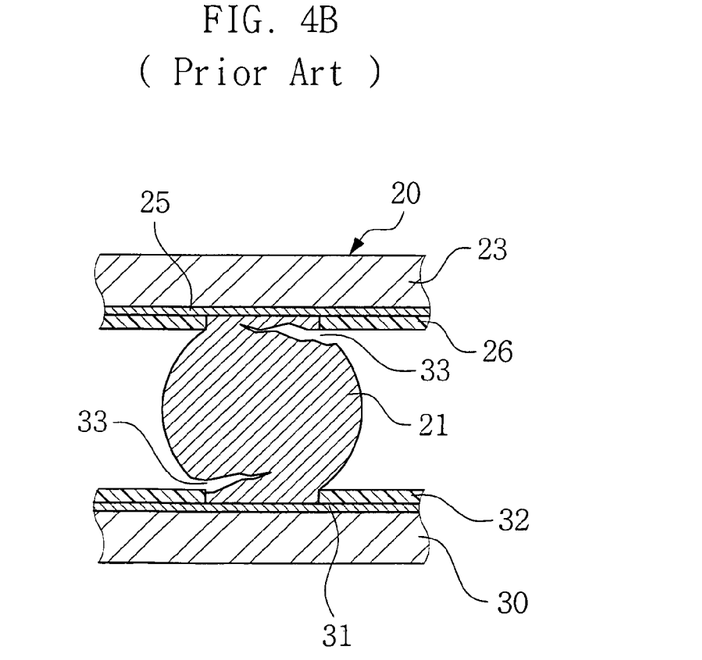

The conventional structure may have several drawbacks. For example, the coefficient of thermal expansion of the semiconductor package 20 may be different relative to that of the package mounting substrate 30. A difference in the coefficient of thermal expansion may cause stresses concentrated on the solder bump 21. Various faults, therefore, may be generated at a solder bump joint. Thus, after an assembly process, for example, the semiconductor package 20 may go through a test process. The test process may involve a temperature cycle. Since the semiconductor package 20 and the package mounting substrate 30 may expand and/or contract differently, e.g., as shown in FIG. 4A, stresses in opposite directions may apply to the semiconductor package 20 and to the package mounting substrate 30. As a result, cracks such as shown in FIG. 4B may occur at the interferences between the solder bump 21 and the copper wiring layers 25 and 31. Such cracks may cause faults in the connection and thereby cause test failure. Furthermore, such cracks may cause undetected weakness in the connection and subsequent external shocks, e.g., during further assembly or later use, may result in connection failure.

SUMMARY

Embodiments of the present invention improve the solder joint reliability between a semiconductor package and a package mounting substrate.

An example embodiment of the present invention provides an improved structure for joining a semiconductor package to a package mounting substrate.

Another example embodiment of the present invention implements a method for joining a semiconductor package to a package mounting substrate.

According to an example embodiment of the present invention, a semiconductor package and a package mounting substrate are joined using a conductive material column such as a solder column. Each of the semiconductor package and the package mounting substrate include an insulating protective opening exposing a wiring layer therein. The solder column resides within the insulating protective openings to electrically couple the wiring layers. By forming the insulating protective openings with sufficient depth, each protects the solder column against stress faults and thereby forms more reliable electrical connections and supports high-density electrical connections between the semiconductor package and the package mounting substrate.

BRIEF DESCRIPTION OF THE DRAWINGS

Example embodiments of the present invention will be readily understood with reference to the following detailed description thereof provided in conjunction with the accompanying drawings, wherein like reference numerals designate like structural elements.

These drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or positioning of the corresponding structural elements that could be encompassed by an actual device manufactured according to the example embodiments of the invention.

DETAILED DESCRIPTION

Example, non-limiting embodiments of the present invention will now be described more fully hereinafter with reference to the accompanying drawings. This invention may, however, be embodied in many different forms and should not be construed as limited to the particular example embodiments set forth herein. Rather, the disclosed embodiments are provided to make a through and complete disclosure, and will fully convey the scope of the invention to those skilled in the art. The principles and features of this invention, therefore, may be employed in varied and numerous embodiments without departing from the scope of the invention.

It should be noted that the figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention. Rather, for simplicity and clarity of illustration, the dimensions of some of the elements are exaggerated relative to other elements.

Further, well-known structures and processes are not described or illustrated in detail to avoid obscuring the present invention. Like reference numerals are used for like and corresponding parts of the various drawings.

Figure 5:
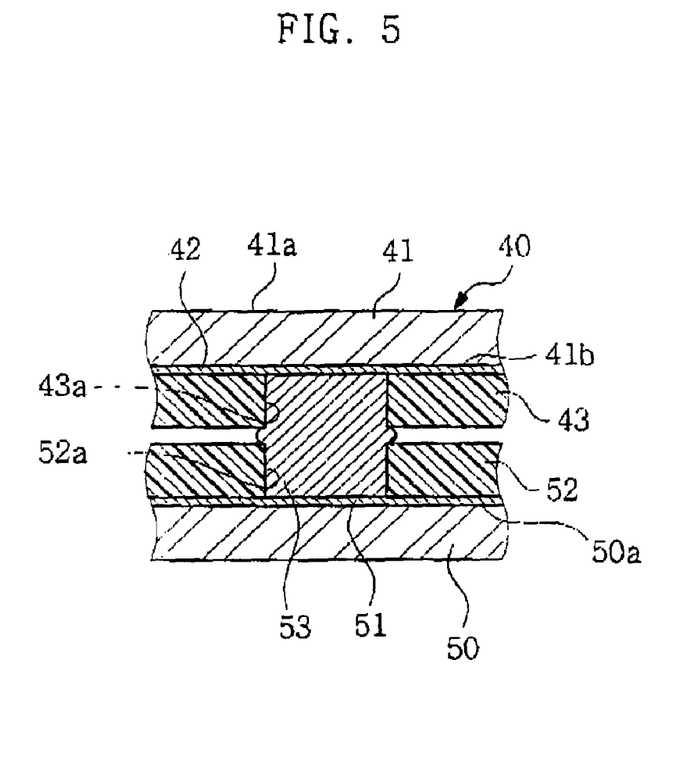
FIG. 5 is a cross-sectional view of a structure for joining a semiconductor package to a package mounting substrate in accordance with an example embodiment of the present invention.

FIG. 5 is a cross-sectional view of a structure joining a semiconductor package to a package mounting substrate in accordance with an example embodiment of the present invention.

Referring to FIG. 5, the structure may comprise a semiconductor package 40, a package mounting substrate 50 and a conductive material column such as a solder column 53. The semiconductor package 40 may include a printed circuit board 41 having a first surface 41a and a second surface 41b, a first wiring layer 42 provided on the second surface 41b, and a first insulating protective layer 43 provided on the first wiring layer 42 and having a first opening to expose a portion of the first wiring layer 42. The package mounting substrate 50 may have a third surface 50a facing the second surface 41b of the printed circuit board 41, a second wiring layer 51 provided on the third surface 50a, and a second insulating protective layer 52 provided on the second wiring layer 51 and having a second opening to expose a portion of the second wiring layer 51. The solder column 53 may be configured to join the semiconductor package 40 to the package mounting substrate 50. The solder column 53 may be connected to the first wiring layer 42 and the second wiring layer 51 through the first opening and the second opening, respectively. By forming each of the first and second openings 43a and 52a of sufficient depth, the solder column 53 is sufficiently protected against stress faults at its connection to the wiring layers 42 and 51, respectively. For example, the combined thickness, e.g., sum, of the first insulating protective layer 43 and the second insulating protective layer 52 may correspond to 20% to 100% of the height of the solder column 53. For example, the combined thicknesses of the first insulating protective layer 43 and the second insulating protective layer 52 may be 80% of the height of the solder column 53. The first insulating protective layer 43 and the second insulating protective layer 52 surround and protect the solder column 53, e.g., against thermal stresses and physical shock, thereby improving the solder joint reliability.

Figure 6A:
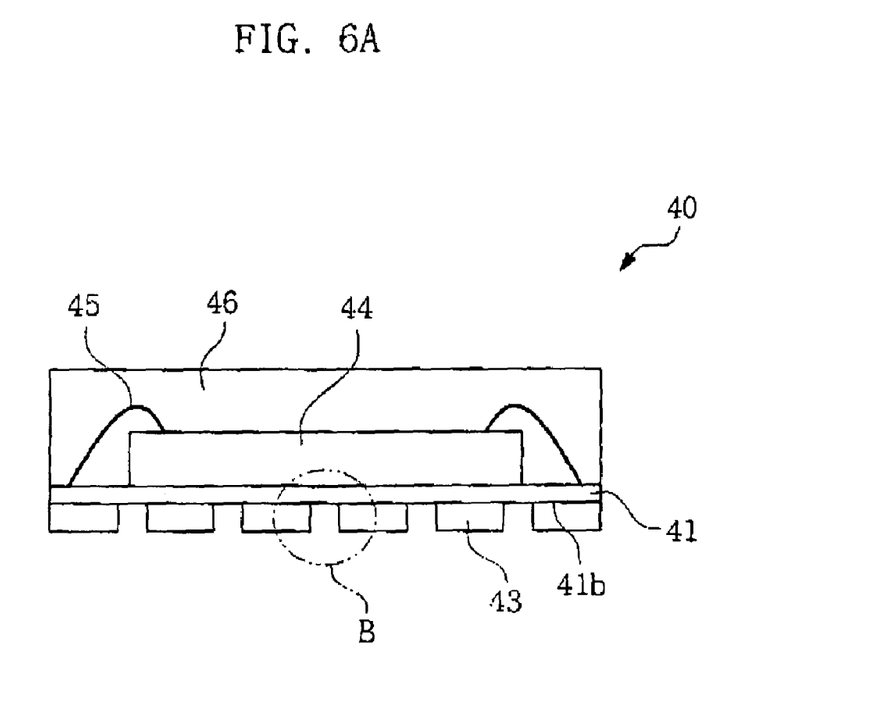
FIG. 6A is a cross-sectional view of the semiconductor package portion of the structure of FIG. 5.

FIG. 6A is a cross-sectional view of the semiconductor package 40 in the structure of FIG. 5.

Referring to FIG. 6A, the semiconductor package 40 may include the printed circuit board 41 and an integrated circuit chip 44 provided on the printed circuit board 41. Bonding wires 45 may connect the printed circuit board 41 to the integrated circuit board 44. An encapsulant 46 may seal the integrated circuit chip 44 and the bonding wires 45. The semiconductor package 40 may be mechanically and electrically connected to the package mounting substrate 50 such that the second surface 41b of the printed circuit board 41 may face the package mounting substrate 50 (FIG. 5).

Figure 6B:
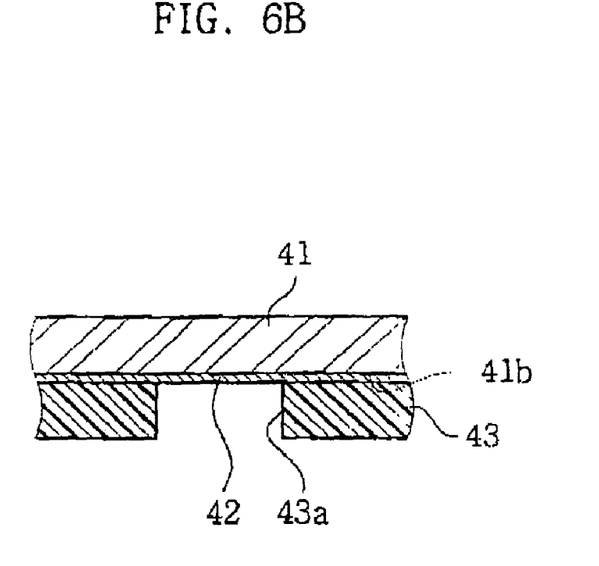
FIG. 6B is an enlarged cross-sectional view of area B in FIG. 6A.

FIG. 6B is an enlarged cross-sectional view of area B in FIG. 6A.

Referring to FIG. 6B, the first wiring layer 42 may be provided on the second surface 41b of the printed circuit board 41. The first insulating protective layer 43 may be provided on the first wiring layer 42 and may have a first opening 43a to expose a portion of the first wiring layer 42. The first insulating protective layer 43 may be formed from a photo solder resist and may be thicker than an insulating protective layer of conventional printed circuit boards.

Figure 7A:
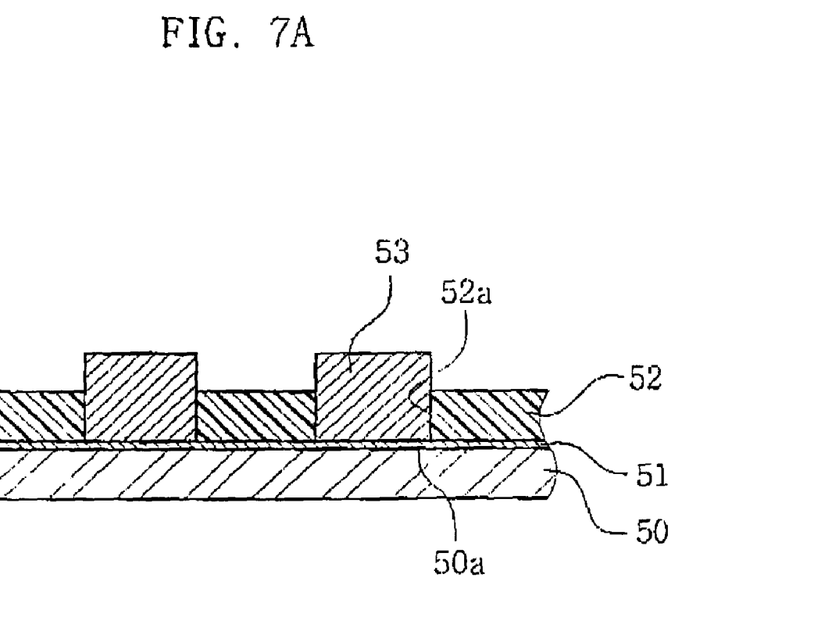
FIG. 7A is a cross-sectional view of the package mounting substrate portion of the structure of FIG. 5.

FIG. 7A is a cross-sectional view of the package mounting substrate 50 in the structure of FIG. 5.

Referring to FIG. 7A, the package mounting substrate 50 may include a module substrate for a memory module and a system substrate for an electronic apparatus. The second wiring layer 51 may be provided on the third surface 50a of the package mounting substrate 50. The second insulating protective layer 52 may be provided on the second wiring layer 51 and may have a second opening 52a to expose a portion of the second wiring layer 51 and to receive the solder column 53 as described more fully hereafter. The second insulating protective layer 52 may be formed from a photo solder resist and may be thicker than an insulating protective layer of conventional printed circuit boards.

The solder column 53 may be formed in the second opening 52a. The solder column 53 may be formed higher than the thickness of the second insulating protective layer 52 whereby the solder column 53 may connect to the semiconductor package 40. The solder column 53 may be formed, for example, using a solder paste printing method.

Figure 7B:
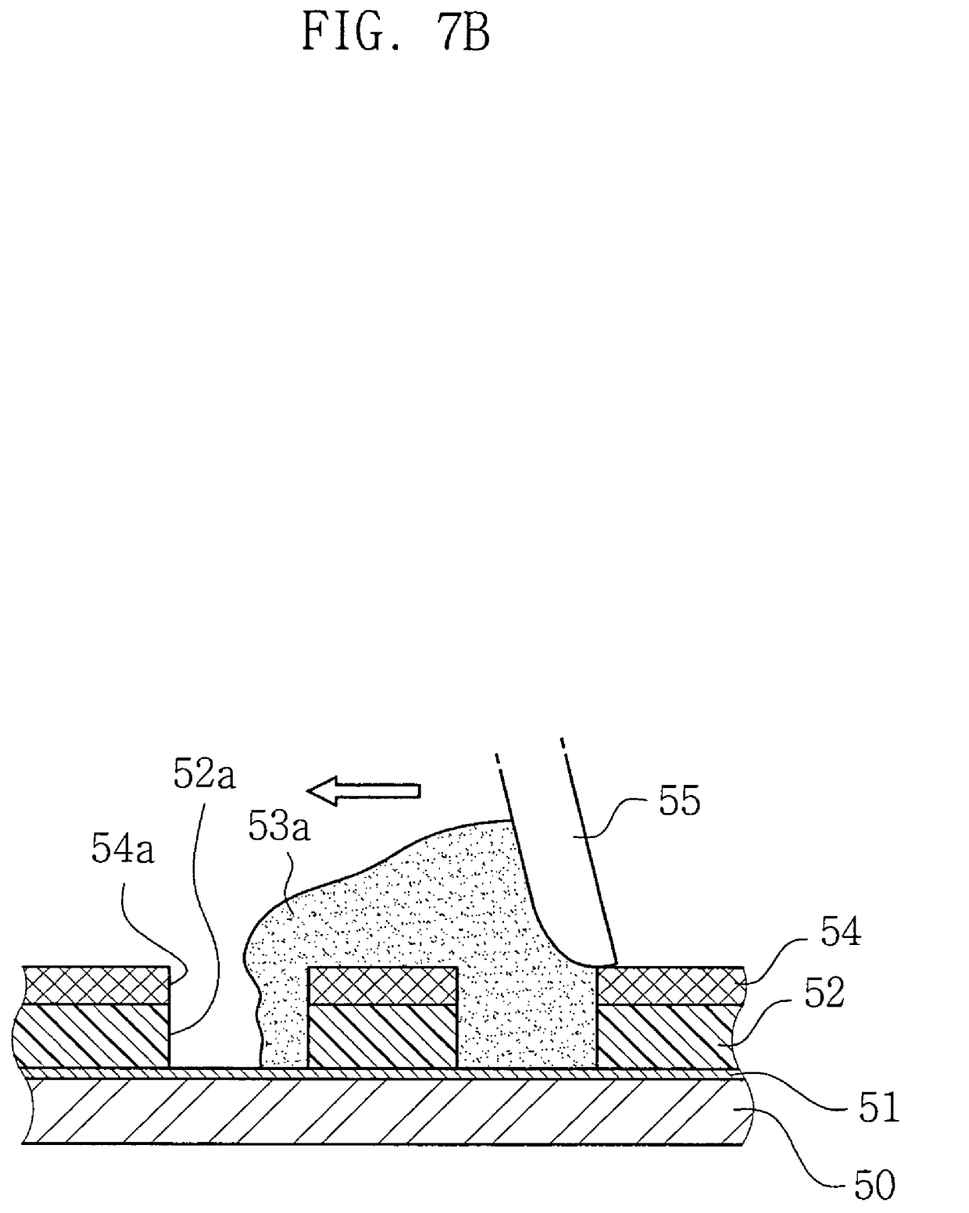
FIG. 7B is a cross-sectional view of a process for forming the package mounting substrate portion of the structure of FIG. 5.

FIG. 7B is a cross-sectional view of a process for forming the package mounting substrate 50 in the structure of FIG. 5.

Referring to FIG. 7B, a mask 54 may be provided on the second insulating protective layer 52. The mask 54 may have third openings 54a formed corresponding to the second openings 52a of the second insulating protective layer 52. The height of the solder column 53 may be determined by the combined heights of the second opening 52a of the second insulating protective layer 52 and the third opening 54a of the mask 54.

A solder paste 53a may be provided in the second opening 52a of the second insulating protective layer 52 and the third opening 54a of the mask 54 using a squeezer 55. The mask 54 is thereafter removed to establish the structure as illustrated in FIG. 7A. In other words, the mask 54 is removed to establish a structure wherein the solder column 53 extends beyond the height of the second opening 52a for insertion into the first opening 43a.

Returning to FIG. 5, the semiconductor package 40 may be mounted on the package mounting substrate 50 having the protruding solder column 53 formed thereon, e.g., as illustrated in FIG. 7A. The solder column 53 may be inserted in the first opening 43a of the semiconductor package 40 thereby allowing the solder column 53 to be connected to the first wiring layer 42. The connection of the solder column 53 to the first wiring layer 42 may be made using, for example, a reflow process.

The combined heights of the first opening 43a of the semiconductor package 40 and the second opening 52a of the package mounting substrate 50 may correspond to about 20% to 100% of the height of the solder column 53. For example, the combined heights of the first opening 43a of the semiconductor package 40 and the second opening 52a of the package mounting substrate 50 may be about 80% of the height of the solder column 53. The heights of the first opening 43a of the semiconductor package 40 and of the second opening 52a of the package mounting substrate 50 may be determined by the thicknesses of the first insulating protective layer 43 and of the second insulating protective layer 52, respectively. Accordingly, the heights of the first and second openings 43a and 52a may each be set during forming of the first and second insulating layers 43 and 52. The height of the first opening 43a may be substantially equal to that of the second opening 52a as illustrated, but not necessarily. The heights of the first opening 43a and of the second opening 52a may each form about 10% to 50% of the height of the solder column 53. For example, the heights of the first opening 43a and of the second opening 52a may each be about 40% of the height of the solder column 53. It will be understood, therefore, that a variety of relative sizing may be used in lower and upper height ranges for the column 53, first opening 43a, and second opening 52a.

Table 1 shows example height range relationships between the height of the solder column 53 and the lower and upper height ranges of the first and second openings 43a and 52a of the semiconductor package 40 and package mounting substrate 50, respectively. It will be understood, however, that embodiments of the present invention need not be restricted to the particular heights and height ranges portrayed in Table 1.

TABLE 1

| Height of solder column (µm) | Height of opening (µm) | | | | | |
| --- | --- | --- | --- | --- | --- | --- |
| | Semiconductor package | | | Package mounting substrate | | |
| | lower | upper | preferred | lower | upper | preferred |
| 350 | 35 | 175 | 140 | 35 | 175 | 140 |
| 300 | 30 | 150 | 120 | 30 | 150 | 120 |
| 250 | 25 | 125 | 100 | 25 | 125 | 100 |

The solder column 53 may have a side surface formed substantially perpendicular to the second surface 41b of the printed circuit board 41 and the third surface 50a of the package mounting substrate 50. The first opening 43a of the first insulating protective layer 43 and the second opening 52a of the second insulating protective layer 52 each may have a metal layer formed on an inner wall thereof. The metal layer may be formed, for example, using a plating method.

In accordance with the example embodiments of the present invention, the method may join a semiconductor package to a package mounting substrate using a solder column, thereby improving the solder joint reliability and quality. While a single solder column 53 has been illustrated, it will be understood that in a typical implementation, a plurality of such columns 53 and corresponding openings 43a and 52a may be used to electrically and reliably couple multiple signals between the semiconductor package 40 and the package mounting structure 50. For example, such plurality of solder columns may be used in a two-dimensional arrangement similar in layout to that of a BGA two-dimensional arrangement.

The use of the solder column may reduce an area of a solder joint, thereby increasing the quantity, e.g., density, of solder joints per unit area. Compared with the same quantity of solder joints in a conventional implementation, a package size and a mounting area under embodiments of the present invention may be reduced.

Thus, a semiconductor package and a package mounting substrate may be joined using a solder column wherein each of the semiconductor package and the package mounting substrate include an insulating protective opening exposing a wiring layer therein. The solder column, residing within the insulating protective openings, electrically couples the wiring layers. By forming the insulating protective openings with sufficient depth, each protects the solder column against stress faults, e.g., as due to thermal effects, and thereby forms more reliable electrical connections. By use of a plurality of such connections, e.g., in a two-dimensional arrangement, reliable and high-density electrical connections between the semiconductor package and the package mounting substrate are desirably achieved.

While particular embodiments of the present invention have been particularly shown and described, it will be understood by those skilled in the art that various changes in form and details may be made therein without departing from the spirit and scope of the invention as defined by the appended claims.

What is claimed is:

1. A structure for joining a semiconductor package to a substrate, the structure comprising:

a semiconductor package including:
   a printed circuit board having a first surface and a second surface opposite to the first surface,
   a first wiring layer provided on the second surface, and
   a first insulating protective layer provided on the first wiring layer and having a first opening to expose a portion of the first wiring layer;

a substrate having a third surface facing the second surface,
   a second wiring layer provided on the third surface, and
   a second insulating protective layer provided on the second wiring layer and having a second opening to expose a portion of the second wiring layer; and a conductive material column provided in the first opening and the second opening to connect the first wiring layer and the second wiring layer, wherein the combined heights of the first opening and the second opening form about 20% to about 100% of the height of the conductive material column, wherein a height of the conductive material column between the second surface and the third surface is substantially constant from a first sidewall of one of the first and second openings to a second sidewall of the one of the first and second openings, and wherein the first insulating protective layer and the second insulating protective layer are formed from a photo solder resist.

2. The structure of claim 1, wherein the conductive material column has a side surface formed substantially perpendicular to the second surface and the third surface.

3. The structure of claim 1, wherein the height of the first opening forms about 10% to about 50% of the height of the conductive material column.

4. The structure of claim 1, wherein the height of the second opening forms about 10% to about 50% of the height of the conductive material column.

5. The structure of claim 1, wherein the combined heights of the first opening and the second opening form about 80% of the height of the conductive material column.

6. The structure of claim 3, wherein the height of the first opening forms about 40% of the height of the conductive material column.

7. The structure of claim 4, wherein the height of the second opening forms about 40% of the height of the conductive material column.

8. A structure for joining a semiconductor package to a substrate, the structure comprising:
a semiconductor package including:
a printed circuit board having a first surface and a second surface opposite to the first surface,
a first wiring layer provided on the second surface, and
a first insulating protective layer provided on the first wiring layer and having a first opening to expose a portion of the first wiring layer;
a substrate having a third surface facing the second surface, a second wiring layer provided on the third surface, and
a second insulating protective layer provided on the second wiring layer and having a second opening to expose a portion of the second wiring layer; and
a conductive material column provided in the first opening and the second opening to connect the first wiring layer and the second wiring layer,
wherein the combined heights of the first opening and the second opening form about 20% to about 80% of the height of the conductive material column, and
wherein a height of the conductive material column between the second surface and the third surface is substantially constant from a first sidewall of one of the first and second openings to a second sidewall of the one of the first and second openings.

9. The structure of claim 8, wherein the conductive material column has a side surface formed substantially perpendicular to the second surface and the third surface.

10. The structure of claim 8, wherein the first insulating protective layer and the second insulating protective layer are formed from a photo solder resist.

11. The structure of claim 8, wherein the height of the first opening forms about 10% to about 50% of the height of the conductive material column.

12. The structure of claim 11, wherein the height of the first opening forms about 40% of the height of the conductive material column.

13. The structure of claim 8, wherein the height of the second opening forms about 10% to about 50% of the height of the conductive material column.

14. The structure of claim 13, wherein the height of the second opening forms about 40% of the height of the conductive material column.

* * * * *